United States Patent [19]

Chapron et al.

[11] Patent Number: 5,213,647
[45] Date of Patent: May 25, 1993

[54] ARRANGEMENT FOR HOLDING TOGETHER A PACKAGE OF BOARDS FOR PRINTED CIRCUITS

[75] Inventors: Jean-Claude Chapron; Alain Sorel, both of Evreux, France

[73] Assignee: U.S. Philips Corporation, New York, N.Y.

[21] Appl. No.: 720,566

[22] Filed: Jun. 25, 1991

[30] Foreign Application Priority Data

Jul. 3, 1990 [FR] France ............................ 90 08376

[51] Int. Cl.$^5$ .......................................... B32B 33/00
[52] U.S. Cl. ................................. 156/252; 156/513; 156/517; 156/524; 156/528; 156/253; 356/256; 356/373; 257/724; 257/701
[58] Field of Search ............... 156/252, 528, 513, 517, 156/524, 253; 357/75, 80; 356/256, 373

[56] References Cited

U.S. PATENT DOCUMENTS

| | | | |
|---|---|---|---|
| 2,557,668 | 6/1951 | Lincoln | 156/513 |
| 3,616,034 | 10/1971 | Obergfell | 156/513 |
| 4,019,826 | 4/1977 | Block | 408/1 R |
| 4,480,364 | 11/1984 | Koswoski | 156/56.6 |
| 5,066,531 | 11/1991 | Legg et al. | 156/253 |

*Primary Examiner*—David A. Simmons
*Assistant Examiner*—Merrick Dixon
*Attorney, Agent, or Firm*—Paul R. Miller

[57] ABSTRACT

An arrangement for holding together a package of boards to be used in the manufacture of printed circuits by applying glue to an edge of the package or by applying glue into holes formed in the boards.

3 Claims, 1 Drawing Sheet

ARRANGEMENT FOR HOLDING TOGETHER A PACKAGE OF BOARDS FOR PRINTED CIRCUITS

The invention relates to a process for holding together packages consisting of boards to be used in the manufacture of printed circuits whereby identical boards are stacked on one another in order to be jointly pierced.

The invention also relates to a device for holding together packages consisting of boards to be used in the manufacture of printed circuits whereby identical boards are stacked on one another in order to be jointly pierced.

According to the prior art, metal dowel pins were used for holding together printed circuit boards, which pins were driven with force through two holes situated at two opposing ends of the circuit, such as the dowel pins 14 in FIG. 2 of the document U.S. Pat. No. 4,019,826. This had several drawbacks: since the dowel pins projected from the exterior surface of the packages, it was impossible to package the latter other than by placing the packages alternately in two mutually perpendicular directions, which complicates the handling procedure. In addition, the dimensions of printed circuits have become progressively greater (700×535 mm is achieved nowadays), so that holding together by two points only is no longer satisfactory, and the printed circuits tend to be pressed insufficiently closely onto one another at some of their areas, which involves the risk of generating copper burrs during piercing, and of uncontrollable mutual movements which result in an inaccurate position of the holes.

The invention has for its object to provide a process and a device for holding together such packages which lead to packages which can be easily stacked, so that their handling is simplified, and with which the printed circuits are perfectly secured on one another, so as to avoid that certain areas of the printed circuits move relative to others under the influence of the piercing action.

For this purpose, the process according to the invention is characterized in that, after the boards have been held provisionally together by any means, the boards are fixed relative to one another by gluing with a plurality of connection points of quick-setting flue situated in the peripheral region of the boards.

It is true that the document U.S. Pat. No. 4,019,826 cited above discloses the use of adhesive tapes. This document, however, is concerned with securing a plate at the surface of a printed-circuit board for protecting the latter, and not with holding together a package of circuits which is to be secured in order to be jointly manipulated. The technical problem, therefore, is totally different from that resolved by the present invention.

In an embodiment, the connection points according to the invention are realised by means of glue lines deposited at regular intervals on the edges of the board packages.

In another embodiment, in which the boards are rectangular, a line of holes is first pierced along each of two parallel sides, after which the glue is caused to run into the said holes.

In this embodiment, the process has the additional advantage that the holes (after being cleared) may be used for positioning the printed circuits.

The device according to the invention is characterized in that it comprises means for provisionally holding the boards together in a package, means for advancing a package step-by-step, and means for depositing quick-setting glue in the peripheral region of the boards.

In a particular embodiment, the device according to the invention is characterized in that, the boards being rectangular and previously pierced with a line of holes along each of two parallel sides, it comprises means for depositing quick-setting glue in the said holes.

It is advantageous to pierce the holes on the same device which effects the gluing, and for that purpose the device is advantageously provided with means for piercing holes along each of two parallel sides of the boards, and with means for depositing quick-setting glue in the said holes.

To facilitate the filling of the holes and to define with accuracy the volume of the deposited glue, the device is advantageously provided with a support surface for the packages made of a material to which the glue does not adhere, and this surface is pierced with holes of a diameter smaller than that of the holes pierced in the boards, for evacuating air, which holes are situated opposite the positions where the holes of the boards are at the moment when the glue is introduced therein.

The following description in combination with the annexed drawings representing non-limitative examples will render it clear how the invention may be carried into practice.

Figure 1:
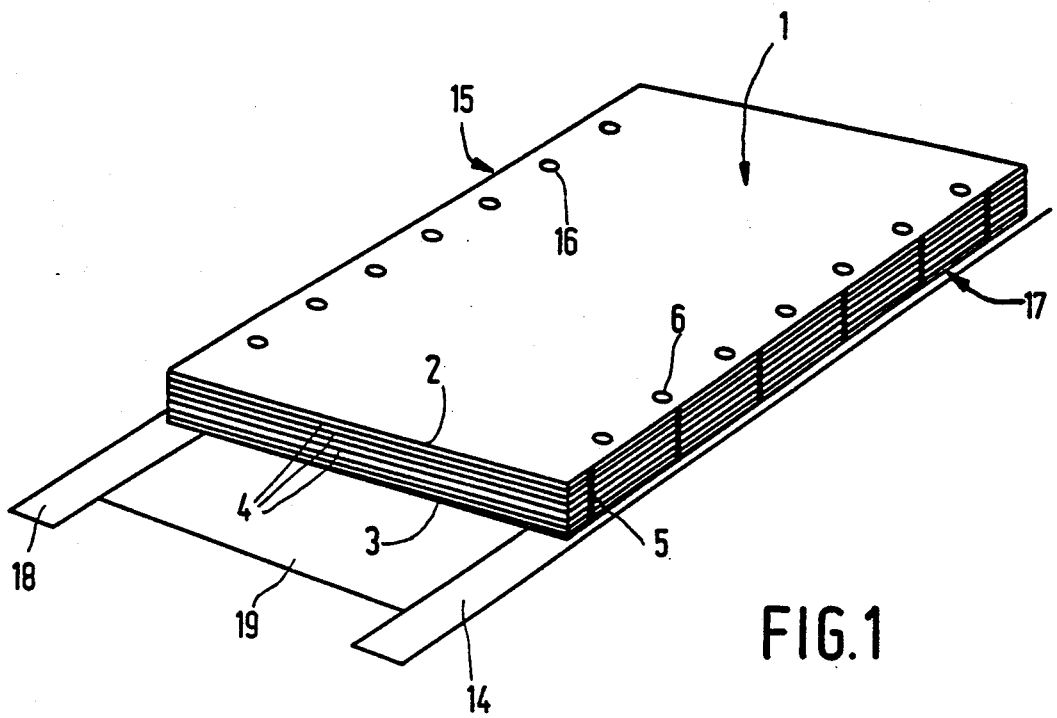
FIG. 1 shows in perspective view a package consisting of boards to be used for the manufacture of printed circuits.

In FIG. 1, package 1 consists of boards 4 to be used in the manufacture of printed circuits. They are, for example, full-area copper-plated boards, i.e. boards on which the conductor track patterns have not yet been etched. After piercing, the walls of the holes just pierced will be covered with copper, after which the tracks will be etched out. The boards are mutually identical and are stacked onto one another in order to be pierced together. In addition, they are placed sandwich-wise between an entrance plate 2, which is made of a soft material (bakelite) for facilitating the entrance of a piercing drill, and an exit plate 3 which has the task of cooling the drill and preventing burrs.

To secure the boards of the package 1 together, it is possible to deposit linear glue stripes, such as the one given the reference numeral 5, by vertically displacing a glue dispenser nozzle (not shown) along the edge of the stack. After the glue lines 5 have been deposited, a curing agent is sprayed onto the edges of the board packages.

In an alternative, preferred embodiment of the process, in which the boards 2, 3, 4 are rectangular, two lines of holes are first drilled along the two parallel sides 15 and 17. To keep the Figure simple, only one hole of each line is shown: one has reference numeral 6 at side 17, and another one has reference numeral 16 at the parallel side 15. After drilling of the holes, a curing agent is made to run into them, and subsequently a quick-setting glue.

Although the embodiment of the process consisting in the deposition of glue lines and that with holes are illustrated in the same FIG. 1, it is of course obvious that in practice either the one or the other embodiment of the process will be used.

The device for carrying out the process is provided with a table, which consists of a fixed part and a moving part. The central portion of the package 1 is placed on the moving part (of which the upper surface is given the reference numeral 19), which is indexed step-by-step between two fixed elements (of which the upper surfaces are referenced 18 and 14) over which the lines of holes 6, 16 glide. The moving part is provided with means for carrying along the boards and for holding them provisionally together in a stack. These means are not shown since they may be chosen from a variety of types, all well known to those skilled in the art, such as hold-down clamps, clips, vices, straps, etc.

Figure 2:
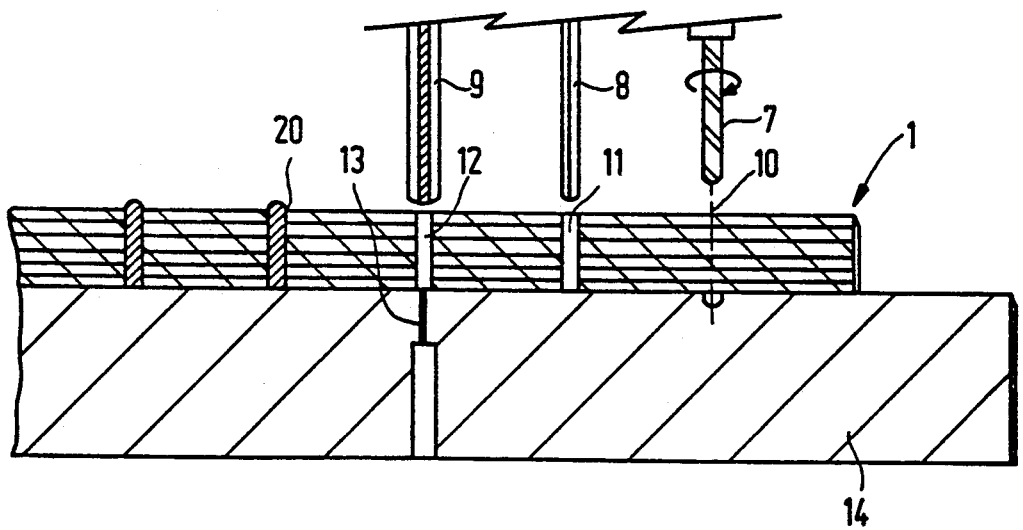
FIG. 2 is a cross-section of a portion of a device for holding together packages of boards.

In FIG. 2, the package 1 is viewed laterally, in cross-section through the plane of the axes of the line of holes 6. Above the fixed element 14 of the table (and also, indeed, above the other fixed element 18 not visible in FIG. 2) are installed piercing means formed by a drill 7 made to rotate by known means which are not shown, a dosing nozzle 8 for depositing a given quantity of a polymerization acceleration product (for example, the product known under the commercial designation "Loctite 745"), and another dosing nozzle 9 for depositing a given quantity of quick-setting glue (for example, the glue which sets almost instantaneously and is known under the commercial designation "Loctite 422"). Dosing nozzles are commercially available. The members 7, 8, 9 are arranged in one and the same line which is parallel to the indexing movement of the moving part of the table (step-by-step to the left in the Figure), and horizontally spaced apart by a distance equal to one index step. Thus a given point of the package 1 will be positioned in turn below the drill 7, then below the nozzle 8 (hole 11), then below the nozzle 9 (hole 12).

At each stop between two index phases of the stack, the drill descends and the nozzles supply a small quantity of product. Thus piercing, deposition of curing agent, and deposition of glue in the hole previously pierced take place in that order. The glue is of a type which is cured almost instantaneously, and the result is that the package is rigidly held together from the moment it leaves the device.

The fixed parts 14 and 18, or at least their upper surfaces on which the package glides, are made of polytetrafluoroethylene ("Teflon"), or of a different, equivalent material to which the glue used will not adhere. In addition, a hole 13 is drilled below each glue dispensing nozzle. This hole is therefore positioned opposite the position of the hole 12 drilled in the boards of the package 1 at the moment the glue is introduced therein. It has a smaller diameter than that of the holes drilled in the boards of the package 1. Its function is to render possible the removal of the air present in the hole when the glue descends therein, while being of such a small diameter that the glue cannot penetrate it owing to the capillary effect.

The reference numeral 20 indicates a finished hole filled with glue. For boards of 700×525 mm, for example, holes interspaced by approximately 8 cm may be provided, having a diameter of approximately 1.5 mm. The holes 13 in the table may then have a diameter of approximately 1 mm. For packages containing two to four boards of a uniform thickness of 1.6 mm and the entrance and exit plates (maximum overall thickness approximately 8 mm), the cycle time is approximately 2 seconds for finishing the drilling simultaneously with the deposition of the products, so that the overall time for one complete package comprising seven holes on either side is 14 seconds.

When it is no longer desired to process the boards in packages, it is possible to detach them by once more drilling through the holes, filled with polymerized glue, for example, with a 2-mm drill, which may suitably be realised on the same device, on which the dosing nozzles are switched off. The holes thus obtained may advantageously be used for correctly positioning the boards in subsequent manufacturing operations (silk-screen printing or photography, metal plating, etc.).

We claim:

1. An arrangement for holding together a package of boards to be used in the manufacture of printed circuits whereby identical rectangular boards are stacked on one another in order to be jointly pierced, characterized in that the arrangement comprises means for provisionally holding the boards together in a package, means for advancing said package step-by-step, said boards having been previously pierced with a line of holes along each of two parallel sides, and means for depositing quick-setting glue in said holes, and characterized in that said arrangement is provided with a support surface for the boards which is pierced with holes of a diameter smaller than that of the holes pierced in the boards, for evacuating air, which holes are situated opposite the positions where the holes of the boards are at the moment when the glue is introduced therein.

2. An arrangement for holding together a package of boards to be used in the manufacture of printed circuits whereby identical rectangular boards are stacked on one another in order to be jointly pierced, characterized in that the arrangement comprises means for provisionally holding the boards together in a package, means for advancing said package step-by-step, means for piercing holes along each of two parallel sides of the boards, and means for depositing quick-setting glue in the holes made by said piercing means, and characterized in that said arrangement is provided with a support surface for the boards which is pierced with holes of a diameter smaller than that of the holes pierced in the boards, for evacuating air, which holes are situated opposite the positions where the holes of the boards are at the moment when the glue is introduced therein.

3. An arrangement as claimed in claim 1 or 2, characterized in that said arrangement is provided with a support surface for said package made of a material to which the glue does not adhere.

* * * * *